(12) United States Patent
Cao et al.

(10) Patent No.: US 8,245,766 B2
(45) Date of Patent: Aug. 21, 2012

(54) FASTENER AND HEAT DISSIPATION DEVICE USING THE SAME

(75) Inventors: Lei Cao, Shenzhen (CN); Min Li, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

( * ) Notice: Subject to any disclaimer, the term of this patent is extended or adjusted under 35 U.S.C. 154(b) by 462 days.

(21) Appl. No.: 12/508,524

(22) Filed: Jul. 23, 2009

(65) Prior Publication Data

US 2010/0230077 A1   Sep. 16, 2010

(30) Foreign Application Priority Data

Mar. 16, 2009   (CN) .......................... 2009 1 0300889

(51) Int. Cl.
*H05K 7/20* (2006.01)
(52) U.S. Cl. ...................................... 165/121; 361/697
(58) Field of Classification Search ............... 403/322.4; 269/236, 254 CS; 24/523, 524
See application file for complete search history.

(56) References Cited

U.S. PATENT DOCUMENTS

| | | | | |
|---|---|---|---|---|
| 2,818,095 A * | 12/1957 | Stahl et al. | ..................... | 269/162 |
| 4,414,605 A * | 11/1983 | Chino et al. | .................. | 361/707 |
| 6,311,766 B1 * | 11/2001 | Lin et al. | ...................... | 165/80.3 |
| 6,392,889 B1 * | 5/2002 | Lee et al. | ....................... | 361/704 |
| 6,497,273 B1 * | 12/2002 | Horng et al. | .................. | 165/80.3 |
| 6,654,246 B2 * | 11/2003 | Wu | ............................... | 361/697 |
| 7,086,456 B2 * | 8/2006 | Lee et al. | ...................... | 165/121 |
| 7,099,156 B2 * | 8/2006 | Chen et al. | .................... | 361/719 |
| 7,289,330 B2 * | 10/2007 | Lu et al. | ......................... | 361/710 |
| 7,414,839 B2 * | 8/2008 | Yu et al. | ......................... | 361/695 |
| 7,423,873 B2 * | 9/2008 | Shuai et al. | ................... | 361/697 |
| 7,430,122 B2 * | 9/2008 | Li | ................................. | 361/719 |
| 7,808,790 B2 * | 10/2010 | Lin | ............................... | 361/719 |
| 2004/0000398 A1 * | 1/2004 | Lee et al. | ...................... | 165/185 |
| 2008/0106869 A1 * | 5/2008 | Li | ................................. | 361/704 |
| 2008/0156458 A1 * | 7/2008 | Li et al. | ......................... | 165/80.3 |

* cited by examiner

*Primary Examiner* — Allen Flanigan
(74) *Attorney, Agent, or Firm* — Altis Law Group, Inc.

(57) ABSTRACT

A fastener includes an upper mounting portion, a lower mounting portion, a connecting portion extending through the upper mounting portion and connecting the lower mounting portion, a resilient portion set on the connecting portion and pressing the upper mounting portion, at least a supporting portion with a first end thereof connecting the upper mounting portion, and an operating portion pivotally connecting a second end of the at least a supporting portion. The operating portion includes a cam abutting against the connecting portion. The cam is rotatable relative to the at least a supporting portion, to bring the upper mounting portion to move up and down, and make the fastener shift between a locked state in which a fan is securely sandwiched between the upper and lower mounting portions and a released state in which the upper mounting portion is disengaged from the fan.

19 Claims, 6 Drawing Sheets

FASTENER AND HEAT DISSIPATION DEVICE USING THE SAME

BACKGROUND

1. Technical Field

The disclosure relates to heat dissipation and, more particularly, to a fastener capable of conveniently fastening a fan on or detaching the fan from a heat sink, and a heat dissipation device using the fastener.

2. Description of Related Art

Nowadays, numerous heat dissipation devices are used to dissipate heat generated by electronic devices. Generally, a heat dissipation device comprises a heat sink and a fan. The fan is fastened on the heat sink via a plurality of screws served as fasteners. The fan needs to be disassembled from the heat sink for maintenance or replacing with another fan after the fan is used for a long time. In disassembly, since the fan connects the heat sink via the screws, an additional tool is required to detach the screws from the heat sink. Thus, it is inconvenient to disassemble the fan from the heat sink.

What is needed, therefore, is a fastener and a heat dissipation device using the fastener which can overcome the limitation described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
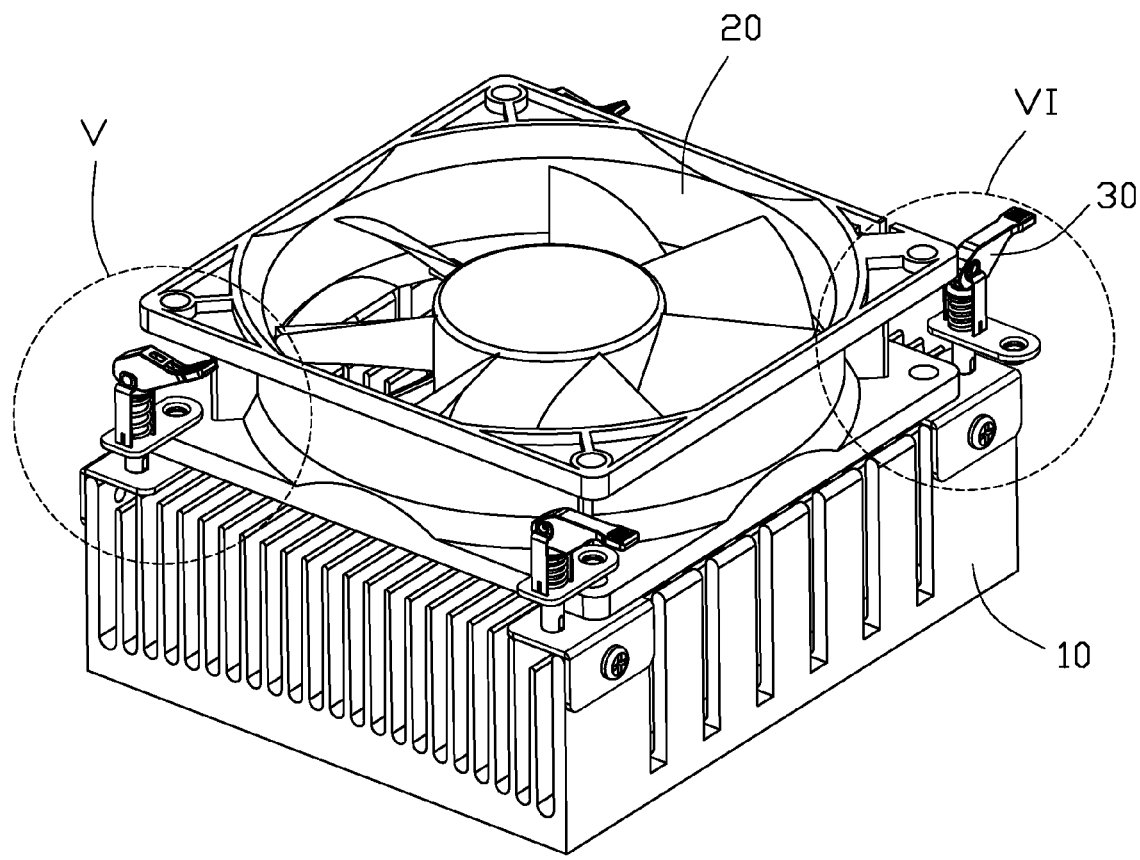
FIG. 1 is an isometric, assembled view of a heat dissipation device in accordance with one embodiment of the disclosure.

Referring to FIG. 1, a heat dissipation device in accordance with an embodiment of the disclosure comprises a heat sink 10, a fan 20, and four fasteners 30 fastening the fan 20 on the heat sink 10.

Figure 2:
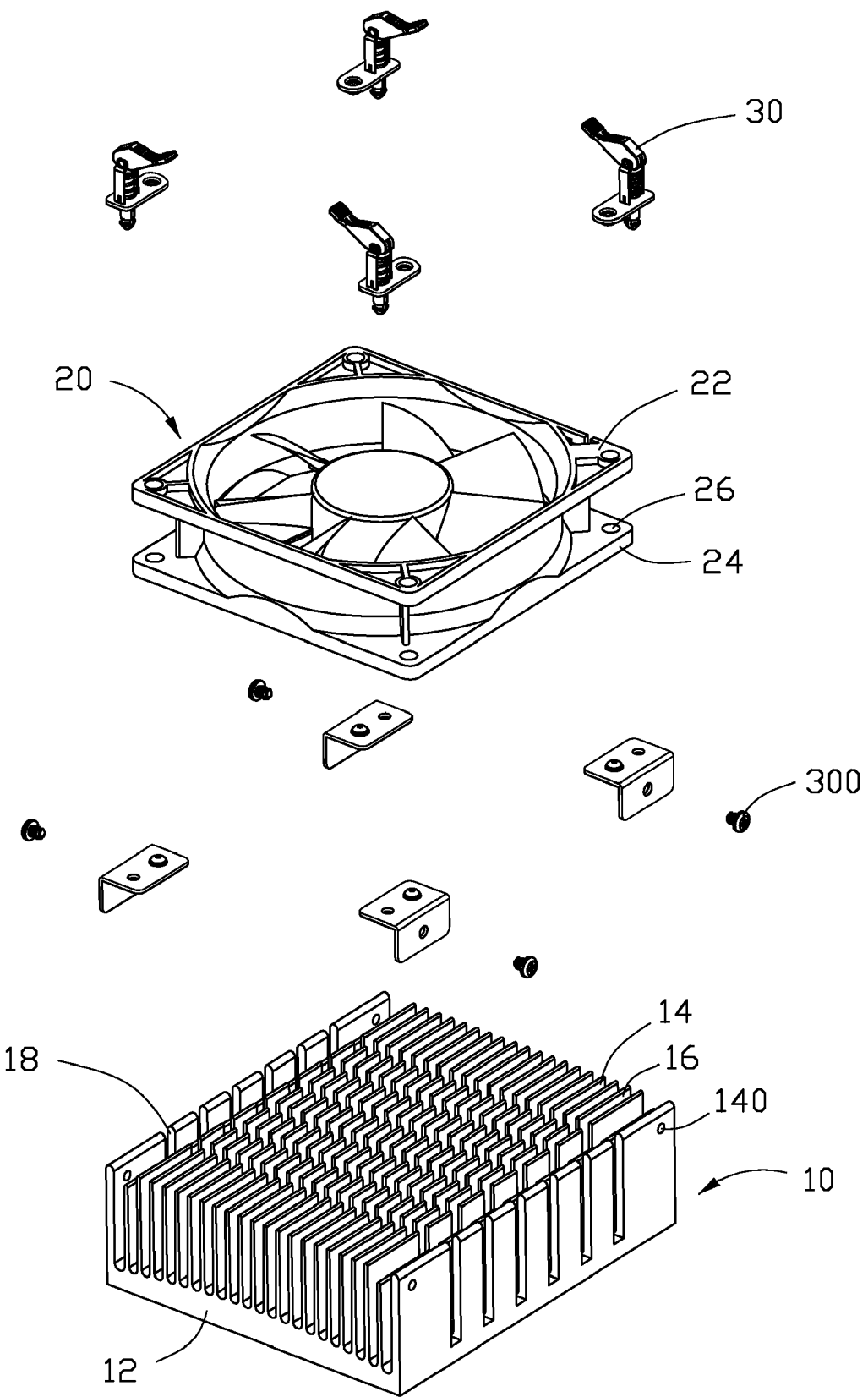
FIG. 2 is an isometric, exploded view of the heat dissipation device of FIG. 1.

Also referring to FIG. 2, the heat sink 10 is integrally made of metal such as aluminum, copper or an alloy thereof. The heat sink 10 includes a heat conducting plate 12 and a plurality of fins 14 upwardly extending from a top face of the heat conducting plate 12. The fins 14 are parallel with each other and arranged on the top face of the heat conducting plate 12 in a matrix. Along a front-to-rear direction of the heat sink 10, adjacent rows of fins 14 form a plurality of first airflow channels 16 therebetween. Along a left-to-right direction of the heat sink 10, adjacent lines of fins 14 form a plurality of second airflow channels 18 therebetween. Four fins 14 at four corners of the heat sink 10 each define a threaded hole 140 in a top end thereof.

The fan 20 is generally rectangular in shape and includes an upper flange 22 and a lower flange 24 parallel to the upper flange 22. Each of the upper and lower flanges 22, 24 defines four through holes 26 in four corners thereof.

Figure 3:
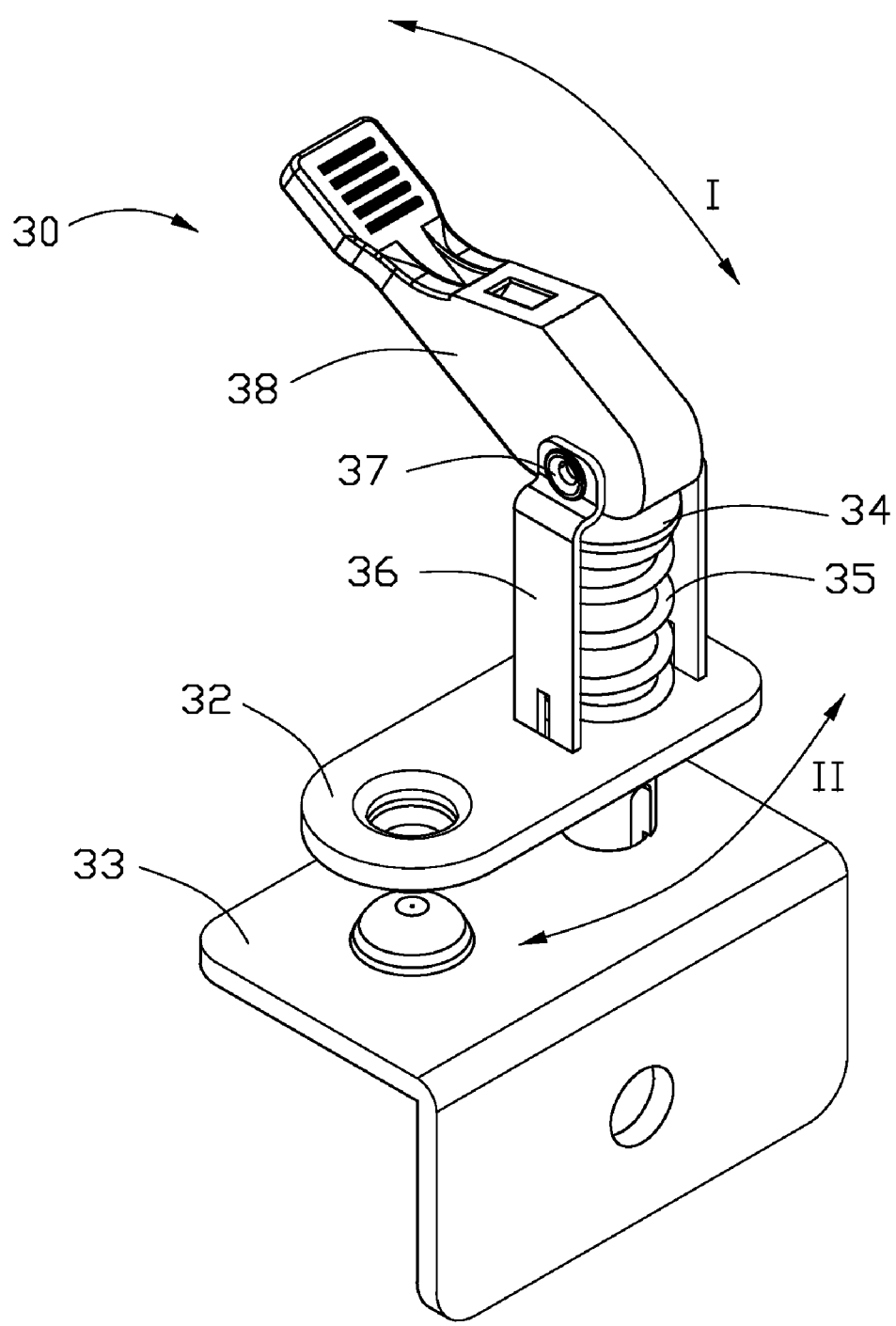
FIG. 3 is an isometric, assembled view of a fastener of the heat dissipation device of FIG. 1.
Figure 4:
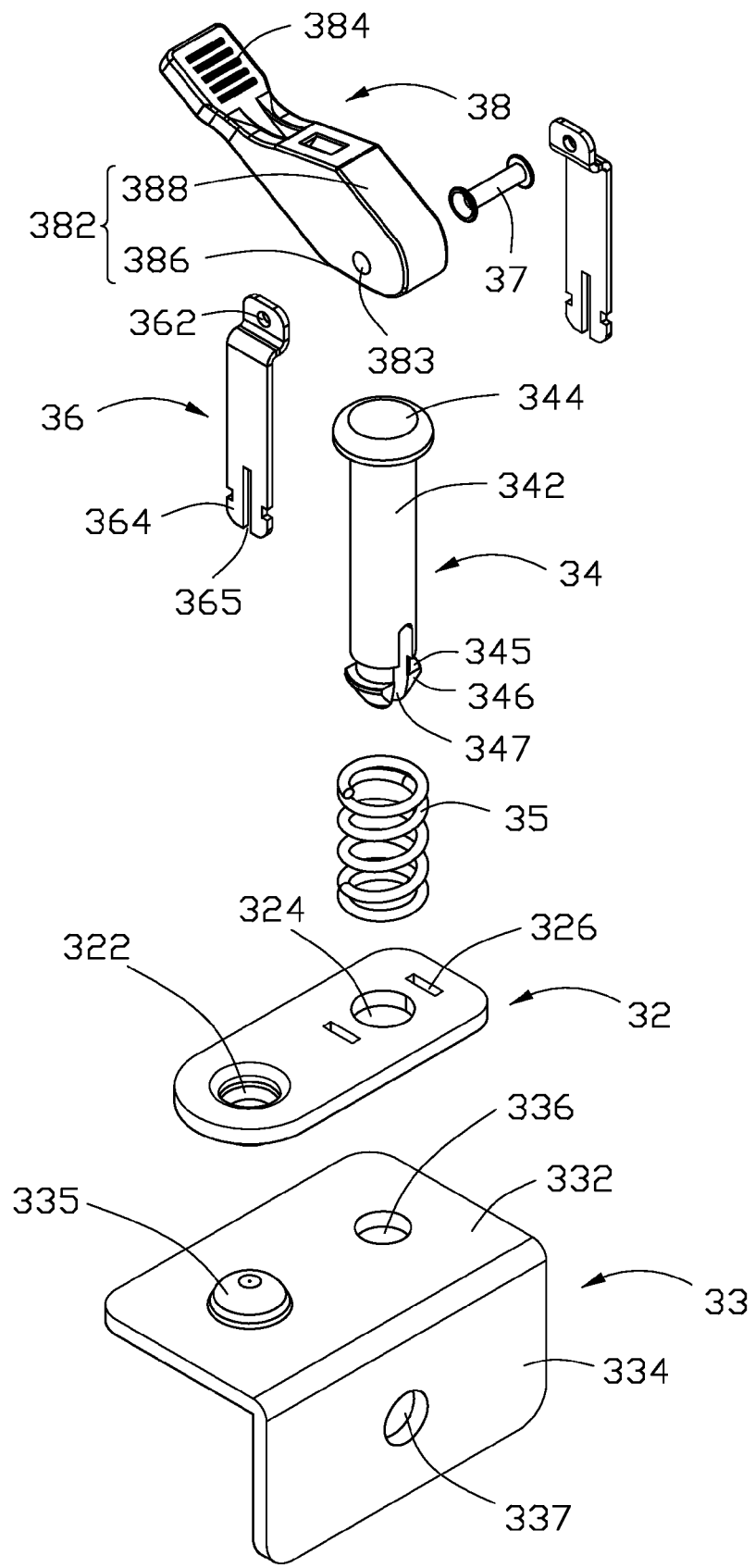
FIG. 4 is an isometric, exploded view of the fastener of FIG. 3.

Also referring to FIGS. 3-4, each fastener 30 includes an upper mounting portion 32, a lower mounting portion 33, a connecting portion 34 connecting the upper and lower mounting portions 32, 33, a resilient portion 35 enclosing the connecting portion 34, two supporting portions 36 connecting the upper mounting portion 32, and an operating portion 38 pivotedly connecting the two supporting portions 36 via a pivot 37. In this embodiment, the resilient portion 35 is a spring.

The lower mounting portion 33 is a bended plate and includes a horizontal mounting plate 332 and a vertical fixing plate 334 downwardly extending from a side of the mounting plate 332. The mounting plate 332 has a first bulge 335 outwardly and upwardly protruding from an end thereof, and defines a first mounting hole 336 in another end thereof. The fixing plate 334 defines a fixing hole 337 corresponding to the threaded hole 140 of the heat sink 10. The upper mounting portion 32 has a second bulge 322 outwardly and downwardly protruding from an end thereof, and defines a second mounting hole 324 in another end thereof, corresponding to the first mounting hole 336 of the lower mounting portion 33. A pair of rectangular buckle holes 326 are defined in the upper mounting portion 32 at two opposite sides of the second mounting hole 324.

The connecting portion 34 includes a cylindrical shaft 342, a head 344 formed at a top end of the shaft 342 and a first buckle 346 formed at a bottom end of the shaft 342. The resilient portion 35 surrounds the shaft 342 of the connecting portion 34. The shaft 342 and the first buckle 346 together define an annular slot 345 therebetween. The first buckle 346 is generally wedge-shaped and defines a first groove 347 along a longitudinal direction thereof. When the connecting portion 34 with the resilient portion 35 circling the shaft 342 thereof extends downwardly through the upper and lower mounting portions 32, 33, the first buckle 346 of the connecting portion 34 is forced by an inner face of the first mounting hole 336 of the lower mounting portion 33 to deform inwardly toward the first groove 347, until the lower mounting portion 33 is received in the slot 345 of the connecting portion 34, in which the first buckle 346 returns to its original position and abuts against a bottom of the mounting plate 332. Simultaneously, the resilient portion 35 is compressed with two ends thereof pressing the head 344 of the connecting portion 34 and a top face of the upper mounting portion 32, respectively.

Each supporting portion 36 defines a first pivot hole 362 in a top thereof, and forms a wedge-shaped second buckle 364 at a bottom thereof. The second buckle 364 defines a second groove 365 along a longitudinal direction thereof. When mounting the supporting portion 36 on the upper mounting portion 32, the second buckle 364 of the supporting portion 36 is forced by an inner face of the buckle hole 326 of the upper mounting portion 32 to deform inwardly toward the second groove 365 until the second buckle 364 totally passes through the buckle hole 326 and reaches a bottom of the upper mounting portion 32, in which the second buckle 364 returns to its original position and engages the bottom of the upper mounting portion 32.

Figure 5:
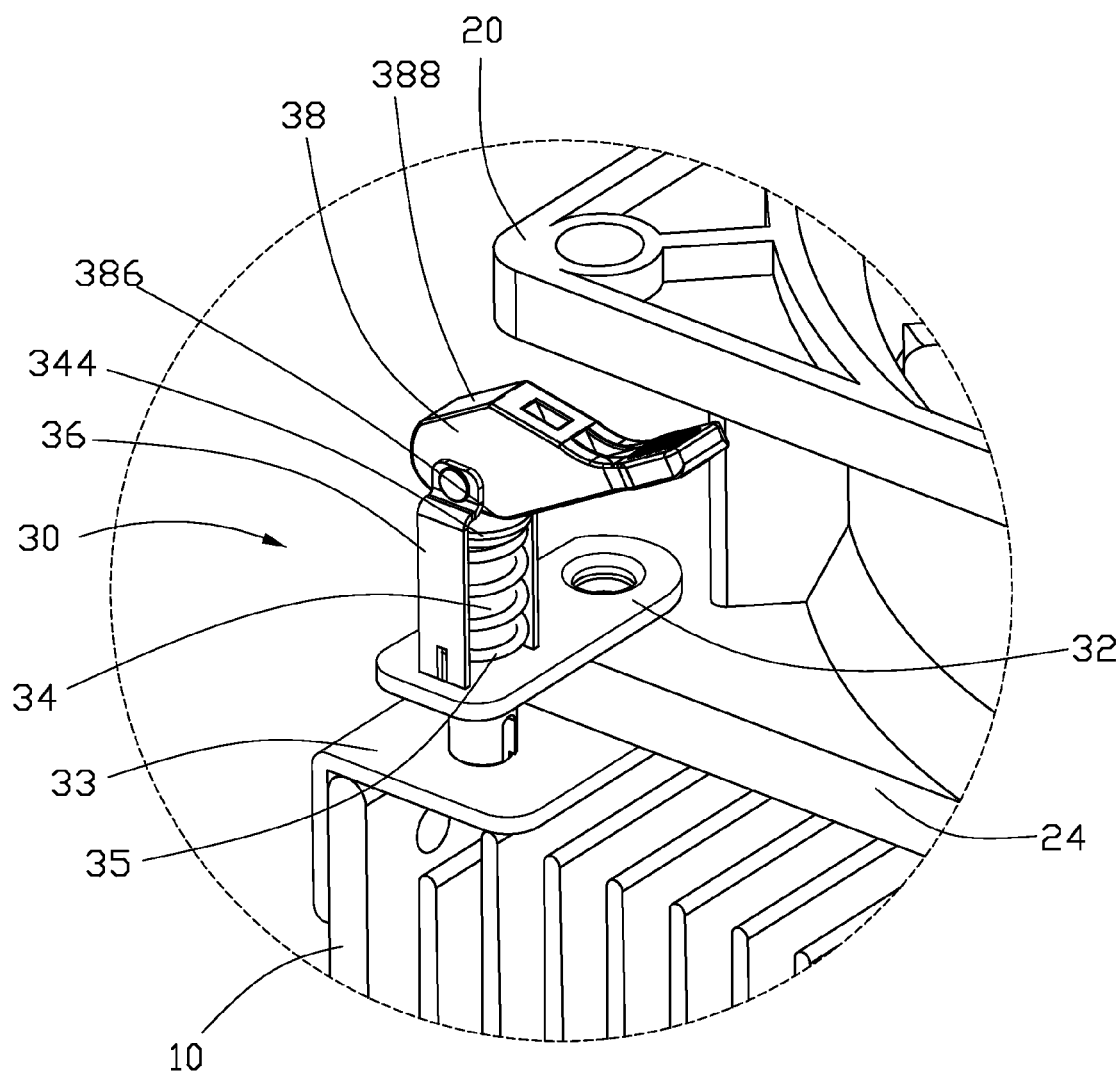
FIG. 5 is an enlarged view of a part V shown in FIG. 1, wherein the fastener is in a locked state.
Figure 6:
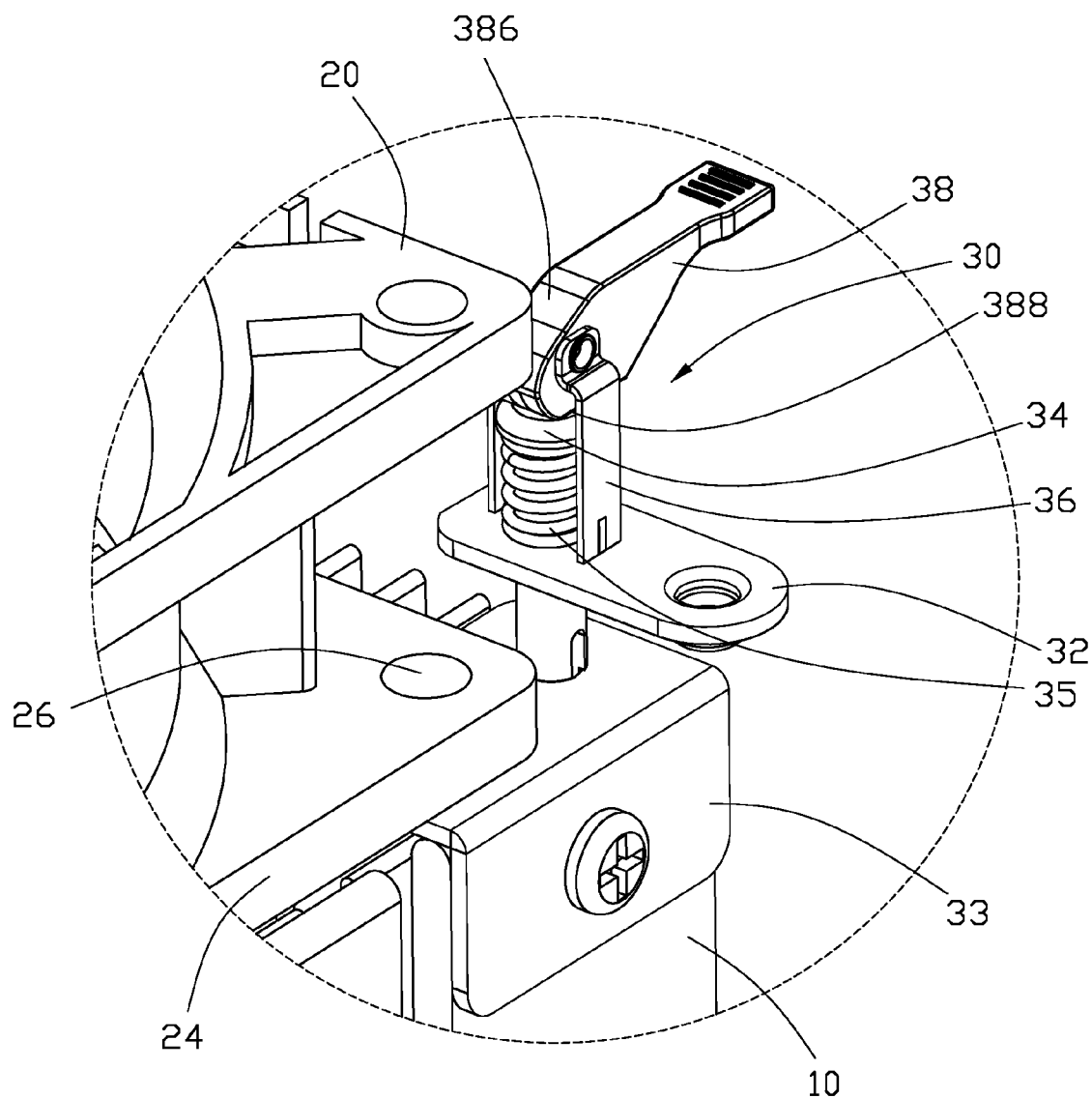
FIG. 6 is an enlarged view of a part VI shown in FIG. 1, wherein the fastener is in a released state.

Also referring to FIGS. 5-6, each operating portion 38 includes a cam 382 and a handle 384 extending from an end of the cam 382. The cam 382 defines a second pivot hole 383 therein. The pivot 37 extends through the first pivot holes 362 of the supporting portions 36 and the second pivot hole 383 of the cam 382 in sequence to pivotably connect the supporting portions 36 and the operating portion 38 together. The cam 382 has a locking section 386 and a releasing section 388, wherein a distance between the second pivot hole 383 and the locking section 386 is smaller than a distance between the second pivot hole 383 and the releasing section 388. A user can turn the handle 384 to make the cam 382 rotate around the pivot 37, along a direction I as viewed in FIG. 3, between a first position and a second position, to bring the upper mounting portion 32 to move up and down: when the cam 382 is located at the first position, shown in FIG. 5, the locking section 386 of the cam 382 contacts the head 344 of the connecting portion 34, and the fastener 30 is in a locked state; when the cam 382 is located at the second position, shown in FIG. 6, the releasing section 388 of the cam 382 contacts the head 344 of the connecting portion 34, the fastener 30 is in a released state. The cam 382 of the operating portion 38 can also rotate, relative to the connecting portion 34, along a direction II also shown in FIG. 3, to bring the upper mounting portion 32 to rotate around the connecting portion 34, along the direction II.

In assembly, four screws 300 extend through the fixing holes 337 of the lower mounting portions 33 of the four fasteners 30 and engage in the threaded holes 140 of the heat sink 10 to fix the four fasteners 30 on the four corners of the heat sink 10. The handles 384 of the operating portions 38 are turned to bring the cams 382 to rotate along the direction I, to make the releasing sections 388 of the cams 382 slidably contact with the heads 344 of the connecting portions 34, during which the upper mounting portions 32 move upwardly till the cams 382 are located at the second position shown in FIG. 6. The fan 20 is then placed on the heat sink 10 to make the first bulges 335 of the lower mounting portions 33 insert into the through holes 26 of the lower flange 24 of the fan 20. The cams 382 of the operating portions 38 are rotated along the direction II, to bring the upper mounting portions 32 to rotate around the connecting portions 34, respectively, to move the second bulges 322 of the upper mounting portions 32 toward the through holes 26 of the lower flange 24 of the fan 20 until the second bulges 322 are located over the through holes 26, respectively. Thereafter the cams 382 of the operating portions 38 are rotated along the direction I, to make the locking sections 386 of the cams 382 slidably contact the heads 344 of the connecting portions 34, during which the upper mounting portions 32 move downwardly till the cams 382 are located at the first position shown in FIG. 5, and the second bulges 322 of the upper mounting portions 32 are lowered to insert into the through holes 26 of the lower flange 24 of the fan 20. The resilient portions 35 of the fasteners 30 are compressed whenever the fasteners 30 are at the first position or at the second position. During the cams 382 rotating from the first position to the second position, since the cams 382 bring the upper mounting portions 32 to move upwardly, the resilient portions 35 are further compressed.

Since a disassembly of the fan 20 from the heat sink 10 of the heat dissipation device is opposite to the assembly process, a detailed description thereof is omitted here for conciseness.

According to the disclosure, since the operating portions 38 of the fasteners 30 can rotate along two different directions to shift the fasteners 30 between the locked state and the released state, it is convenient to mount the fan 20 on the heat sink 10 or disassemble the fan 20 from the heat sink 10, without using a tool.

It is believed that the disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A fastener for mounting a fan to a heat sink, comprising:
an upper mounting portion for selectively engaging with the fan;
a lower mounting portion for securing to the heat sink;
a connecting portion extending through the upper mounting portion and being connected to the lower mounting portion;
a resilient portion set on the connecting portion and pressing the upper mounting portion;
at least a supporting portion with a first end thereof connected to the upper mounting portion; and
an operating portion pivotedly connected to a second end of the at least a supporting portion and comprising a cam; wherein the cam abuts against the connecting portion and is rotatable relative to the at least a supporting portion, along a first direction, to bring the upper mounting portion to move up and down, and make the fastener shift between a locked state in which the upper mounting portion engages with the fan and a released state in which the upper mounting portion disengages from the fan;
wherein the connecting portion comprises a shaft and a head formed at an end of the shaft, the resilient portion surrounding the shaft of the connecting portion and being compressed with two ends thereof pressing the head of the connecting portion and the upper mounting portion, respectively; and
wherein the connecting portion further comprises a buckle formed at another end of the shaft, the shaft and the buckle together defining a slot therebetween, the lower mounting portion being received in the slot of the connecting portion.

2. The fastener as claimed in claim 1, wherein the number of the at least a supporting portion is two, each supporting portion forms a buckle at the first end thereof, the buckle of each supporting portion being inserted in the upper mounting portion, the second end of each supporting portion pivotedly connected to the cam of the operating portion via a pivot.

3. The fastener as claimed in claim 2, wherein the cam of the operating portion abuts against the head of the connecting portion and has a locking section and a releasing section, a distance between the pivot and the locking section being smaller than a distance between the pivot and the releasing section.

4. The fastener as claimed in claim 3, wherein when the locking section of the cam of the operating portion abuts against the head of the connecting portion, the fastener is in the locked state, and when the releasing section of the cam abutting against the head of the connecting portion, the fastener is in the released state.

5. The fastener as claimed in claim 1, wherein the cam of the operating portion is rotatable relative to the connecting portion, along a second direction, to bring the upper mounting portion to rotate around the connecting portion.

6. The fastener as claimed in claim 1, wherein the operating portion further comprises a handle extending from an end of the cam.

7. A heat dissipation device, comprising:
a heat sink;
a fan; and
a plurality of fasteners fastening the fan on the heat sink, each of the fasteners comprising:
an upper mounting portion;

a lower mounting portion fixed on the heat sink;

a connecting portion extending through the upper mounting portion and being connected to the lower mounting portion;

a resilient portion set on the connecting portion and pressing the upper mounting portion;

at least a supporting portion with a first end thereof connected to the upper mounting portion; and an operating portion pivotedly connected to a second end of the at least a supporting portion and comprising a cam abutting against the connecting portion;

wherein the fan is located between the upper mounting portion and the lower mounting portion of each fastener, the cam being rotatable relative to the at least a supporting portion, along a first direction, to bring the upper mounting portion to move up and down, and make the fastener shift between a locked state in which the upper mounting portion engages with the fan and a released state in which the upper mounting portion is separated from the fan.

8. The heat dissipation device as claimed in claim 7, wherein a first bulge outwardly and upwardly protrudes from the lower mounting portion of each fastener, a second bulge outwardly and downwardly protruding from the upper mounting portion of each fastener, the fan having a flange, a plurality of through holes being defined in a periphery of the flange of the fan, the first and second bulges of each fastener being inserted into a corresponding through hole of the flange of the fan when the fastener is located at the locked state, the second bulge leaving the corresponding through hole when the fastener is located at the released state.

9. The heat dissipation device as claimed in claim 7, wherein the resilient portion of each fastener is compressed whenever the fastener is in the locked state or in the released state.

10. The heat dissipation device as claimed in claim 7, wherein the number of the at least a supporting portion is two, each supporting portion forms a buckle at the first end thereof, the buckle of each supporting portion being inserted in the upper mounting portion, the second end of each supporting portion pivotedly connected to the cam of the operating portion via a pivot.

11. The heat dissipation device as claimed in claim 10, wherein the cam of the operating portion has a locking section and a releasing section, a distance between the pivot and the locking section being smaller than a distance between the pivot and the releasing section.

12. The heat dissipation device as claimed in claim 11, wherein when the locking section of the cam of the operating portion abuts against the connecting portion, the fastener is in the locked state, and when the releasing section of the cam abuts against the connecting portion, the fastener is in the released state.

13. The heat dissipation device as claimed in claim 7, wherein the cam of the operating portion is rotatable relative to the connecting portion, along a second direction, to bring the upper mounting portion to rotate around the connecting portion.

14. The heat dissipation device as claimed in claim 7, wherein the operating portion further comprises a handle extending from an end of the cam.

15. A fastener for mounting a fan to a heat sink, comprising:

an upper mounting portion for selectively engaging with the fan;

a lower mounting portion for securing to the heat sink;

a connecting portion extending through the upper mounting portion and being connected to the lower mounting portion;

a resilient portion set on the connecting portion and pressing the upper mounting portion;

at least a supporting portion with a first end thereof connected to the upper mounting portion; and an operating portion pivotedly connected to a second end of the at least a supporting portion and comprising a cam; wherein the cam abuts against the connecting portion and is rotatable relative to the at least a supporting portion, along a first direction, to bring the upper mounting portion to move up and down, and make the fastener shift between a locked state in which the upper mounting portion engages with the fan and a released state in which the upper mounting portion disengages from the fan;

wherein the cam of the operating portion is rotatable relative to the connecting portion, along a second direction, to bring the upper mounting portion to rotate around the connecting portion.

16. The fastener as claimed in claim 15, wherein the connecting portion comprises a shaft and a head formed at an end of the shaft, the resilient portion surrounding the shaft of the connecting portion and being compressed with two ends thereof pressing the head of the connecting portion and the upper mounting portion, respectively.

17. The fastener as claimed in claim 16, wherein the number of the at least a supporting portion is two, each supporting portion forms a buckle at the first end thereof, the buckle of each supporting portion being inserted in the upper mounting portion, the second end of each supporting portion pivotedly connected to the cam of the operating portion via a pivot.

18. The fastener as claimed in claim 17, wherein the cam of the operating portion abuts against the head of the connecting portion and has a locking section and a releasing section, a distance between the pivot and the locking section being smaller than a distance between the pivot and the releasing section.

19. The fastener as claimed in claim 18, wherein when the locking section of the cam of the operating portion abuts against the head of the connecting portion, the fastener is in the locked state, and when the releasing section of the cam abutting against the head of the connecting portion, the fastener is in the released state.

* * * * *